United States Patent
Ohtsuji et al.

(10) Patent No.: US 8,174,847 B2
(45) Date of Patent: May 8, 2012

(54) SHIELD CASE AND CIRCUIT BOARD ASSEMBLY

(75) Inventors: Takahisa Ohtsuji, Yao (JP); Takayuki Nagata, Yao (JP)

(73) Assignee: Hosiden Corporation, Yao-Shi (JP)

(*) Notice: Subject to any disclaimer, the term of this patent is extended or adjusted under 35 U.S.C. 154(b) by 537 days.

(21) Appl. No.: 12/389,663

(22) Filed: Feb. 20, 2009

(65) Prior Publication Data

US 2009/0257213 A1 Oct. 15, 2009

(30) Foreign Application Priority Data

Apr. 11, 2008 (JP) ................................. 2008-103426

(51) Int. Cl.
*H05K 7/14* (2006.01)
(52) U.S. Cl. ... 361/818; 361/800; 361/816; 361/679.01; 439/55; 439/76.1
(58) Field of Classification Search ............... 439/76.1, 439/79, 610, 607.01–607.59; 174/359; 361/818, 361/800, 816, 679.01
See application file for complete search history.

(56) References Cited

U.S. PATENT DOCUMENTS

| | | | | |
|---|---|---|---|---|
| 5,147,220 A | * | 9/1992 | Lybrand | 439/567 |
| 5,836,774 A | * | 11/1998 | Tan et al. | 439/76.1 |
| 5,941,725 A | * | 8/1999 | Brennan et al. | 439/357 |
| 6,135,807 A | * | 10/2000 | Lai et al. | 439/455 |
| 6,139,365 A | * | 10/2000 | Lok | 439/607.01 |
| 6,219,252 B1 | * | 4/2001 | Tsai | 361/752 |
| 7,410,366 B2 | * | 8/2008 | Wu | 439/76.1 |

FOREIGN PATENT DOCUMENTS

| | | |
|---|---|---|
| JP | 54-104965 U | 1/1953 |
| JP | 63-108173 U | 7/1988 |
| JP | 2-120783 | 9/1990 |
| JP | 11-329596 A | 11/1999 |
| JP | 2000-049486 A | 2/2000 |
| JP | 2002-335084 A | 11/2002 |
| JP | 2003-142211 A | 5/2003 |
| JP | 2005-99506 A1 | 4/2005 |

OTHER PUBLICATIONS

Notification of Reasons for Refusal dated Dec. 13, 2011 for counterpart Japanese application No. 2008-103426 with English translation.

* cited by examiner

*Primary Examiner* — Angel R Estrada
*Assistant Examiner* — Dimary Lopez
(74) *Attorney, Agent, or Firm* — Kratz, Quintos & Hanson, LLP

(57) ABSTRACT

A shield case of the present invention include a first case; and a second case, combinable with the first case. The first and second cases are provided with a plurality of abutting parts. The abutting parts abut on all respective surfaces of the component mounting board and hold the component mounting board in suspension in a state where the first and second cases are combined.

13 Claims, 5 Drawing Sheets

SHIELD CASE AND CIRCUIT BOARD ASSEMBLY

The present application claims priority under 35 U.S.C. §119 of Japanese Patent Application No. 2008-103426 filed on Apr. 11, 2008, the disclosure of which is expressly incorporated by reference herein in its entity.

TECHNICAL FIELD

The present invention relates to shield cases used for connectors or other devices applied with electromagnetic Interference (EMI) preventive measures and further relates to circuit board assemblies having such shield cases.

BACKGROUND ART

Among conventional circuit board assemblies of this type, some are known to prevent electronic components and a conductive line on a component mounting board from coming into contact with a shield case so as not to bring about a short-circuited state. Japanese Unexamined Patent Publication No. 2005-99506 discloses an assembly with a holding member of insulating material to hold the component mounting board in suspension inside a shield case. Japanese Unexamined Utility Model Publication No. 02-120783 discloses another assembly with a plurality of pedestals in a shield case to hold a component mounting board in suspension.

SUMMARY OF INVENTION

Technical Problem

However, the former assembly requires space for containing the holding member in the shield case, causing a problem of upsized assembly. Another problem is increase in costs due to increase of components in number by the holding member.

These problems may be solved in the latter assembly since a component mounting board is held by the plurality of pedestals provided in upper and lower cases of the shied case.

Although the pedestals can fix in position an upper surface, a lower surface, both side surfaces and a front surface of the component mounting board, they cannot fix a rear surface in position. The pedestals thus let the component mounting board move toward the rear end side until the component mounting board is screwed to the lower case. If the component mounting board moves, the upper case and the lower case cannot be combined properly. That is, the latter known assembly has a problem of difficulty in incorporating the component mounting board into the shied case.

Solution to Problems

The present invention has been devised in light of the above-described situation. An object of the invention is to provide a shield case and a circuit board assembly adapted to readily incorporate a component mounting board therein.

The present invention provides a solution to the aforementioned problems. Particularly, a shield case of the invention includes a first case and a second case combinable with the first case. The first and second cases are provided with a plurality of abutting parts. The abutting parts are abuttable on all respective surfaces of the component mounting board and holding the component mounting board in suspension in a state where the first and second cases are combined.

In the above shield case, simply combining the first and second cases allows the abutting parts to abut on all the surfaces of the component mounting board and positionally hold the component mounting board in suspension. The invention is thus advantageous in that the component mounting board can be easily incorporated into the first and second cases. Moreover, the first and second cases do not require an additional component for holding the component mounting board in suspension, leading to reduction in height and in number of components. In summary, the shield case according to the present invention is advantageously easy in the incorporation of the component mounting board and has a reduced number of components, contributing to reduced costs.

If the component mounting board has a first surface, a second surface in opposed relation to the first surface, third and fourth surfaces being end surfaces at ends in a first direction, the first direction being parallel to the first surface, and fifth and sixth surfaces being end surfaces at ends in a second direction, the second direction being parallel to the first surface and intersecting the first direction, it is preferable that the abutting parts include a first abutting part, being provided at the first case and abuttable on the first surface of the component mounting board; a second abutting part, being provided at the second case and abuttable on the second surface of the component mounting board; third and fourth abutting parts, being provided at the first case and abuttable on the third surface and the fourth surface, respectively, of the component mounting board; and fifth and sixth abutting parts, being provided at the second case and abuttable on the fifth surface and the sixth surface, respectively.

In this case, the second surface of the component mounting board is brought into abutment with the second abutting part of the second case, and the fifth and sixth surfaces of the component mounting board are brought into abutment with the fifth and sixth abutting parts of the second case. The component mounting board is thus attached to the second case, so that the second surface, fifth and sixth surfaces of the component mounting board are fixed in position. When combining the first case with the second case housing the component mounting board, the first abutting part of the first case abuts on the first surface of the component mounting board, and the third and fourth abutting parts of the first case abut on the third and fourth surfaces of the component mounting board, respectively. As a result, all the six surfaces of the component mounting board are fixed in position, and the component mounting board is held in suspension inside the combined first and second cases. This is how the fifth and sixth abutting parts of the second case fix the fifth and sixth surfaces of the component mounting board in position, while restricting the movement in the second direction of the component mounting board. Therefore, this aspect of the invention can restrain the component mounting board from moving in the second direction when combining the first case and the second case with the component mounting board attached thereto, making the combining work easier. Even in a case where the component mounting board is first attached to the first case prior to attachment to the second case, a similar effect will be exerted because the third and fourth abutting parts can restrict the component mounting board from moving in the first direction.

The second case substantially of a box shape may include a peripheral wall, the peripheral wall being provided with substantially rectangular first and second notch parts in opposed positions for receiving end portions in the first direction of the component mounting board. The second abutting part may be lower edges of the first and second notch parts of the peripheral wall and, when the first and second notch parts receive the end portions of the component mounting board, the lower edges are abuttable on the second surface of the end portions of the component mounting board. The fifth and sixth abutting parts may be outer edges of the first and second notch parts of the peripheral wall and, when the first and second notch parts receive the end portions of the component mounting board, the outer edges are abuttable on the fifth and sixth surfaces of the component mounting board.

In this case, simply by inserting the end portions of the component mounting board into the first and second notched parts of the second case, the second surface of the end portions of the component mounting board are brought into abutment with the second abutting part of the second case, and at the same time, the fifth and sixth surfaces of the component mounting board are brought into abutment with the fifth and sixth abutting parts of the second case, respectively. That is, simply by inserting the end portions of the compound mounting board into the first and second notched parts of the second case, the fifth and sixth abutting parts fix the fifth and sixth surfaces of the component mounting board in position, restricting the movement in the second direction of the component mounting board. Consequently, this aspect of the invention eases work for combining the first case and the second case with the component mounting board attached thereto.

Moreover, a height position of the second abutting part can be varied by varying the depths of the first and second notched parts. Thus, if the first and second surfaces of the component mounting board are used as electronic component mounting surfaces, easy modification can be made in design such that no electronic component on the second surface comes into contact with the second case, by designing the notched parts of smaller depths so as to raise the height position of the second abutting part.

The first case substantially of a U shape in cross-sectional view may be disposed over the second case and has first and second side walls for covering the first and second notch parts of the second case. In this case, the first and second side walls may be the third and fourth abutting parts, respectively, the third and fourth abutting parts being adapted to cover the first and second notch parts, respectively, and abuttable on the third and fourth surfaces, respectively, of the component mounting board in a state where the first and second side walls cover the first and second notch parts. The first abutting part may be a pair of projections each provided in the first and second side walls, respectively, and the projections being abuttable on respective ends of the first surface of the component mounting board in a state where the first case is disposed over the second case.

In this case, by placing the first case over the second case with the component mounting board attached thereto, the third and fourth abutting parts cover the first and second notched parts and abut on the third and fourth surfaces of the component mounting board, respectively, and at the same time, the first abutting part abuts on the ends of the first surface of the component mounting board. In this manner, the first surface and the third and fourth surfaces, perpendicular to the first surface, of the component mounting board can be fixed in position simply by placing the first case over the second case, making it easier to incorporate the component mounting board into the first and second cases. Even in a case where the component mounting board is attached to the first case prior to attachment to the second case, a similar effect will be exerted because the third and fourth abutting parts can restrict the movement in the first direction of the component mounting board.

In a case where at least one of the surfaces of the component mounting board is provided with a ground line, at least one of the abutting parts is contactable with the ground line while abutting on the at least one surface.

In this case, simply by incorporating the component mounting board into the first and second cases and bringing the at least one of the abutting parts into abutment with the one surface of the component mounting board, the ground line of the component mounting board is connected to the first and second cases. Accordingly, this aspect of the invention can obviate the need for wiring work to connect the ground line of the component mounting board to the first and second cases, contributing to reduced cost.

In a case where the second surface of the component mounting board is provided with a ground line, the second abutting part may be contactable with the ground line while abutting on the second surface. This aspect of the invention also contributes to reduced cost because the wiring work for connecting the ground line of the component mounting board to the first and second cases can be omitted.

Only the second case may be made of a metal plate. Obviously, both the first and second cases may be made of metal plates. In either of these cases, the case/cases can be easily created by press-molding the metal plate/plates. Accordingly, cost reduction can be pursued in this respect as well.

In a case where at least one of the first and second surfaces of the component mounting board is provided with an external connection component, at least one of the first and second cases may have an opening for exposing the external connection component therefrom. In this case, at least one of the first and second cases may have a contact part contactable with a shield part of the external connection part in a state where the first and second cases contain the component mounting board. In this case, simply containing the component mounting board in the first and second cases allows the contact part to be connected to the shield part of the external connection component. Accordingly, this aspect of the invention brings about a further merit in reducing costs because wiring work for connecting the shield part of the external connection part and the first and second cases can be omitted.

If at least one of the first and second cases is made of a metal plate, the contact part may preferably be a cut piece formed by cutting and bending a portion of the metal plate. In this case, the case/cases and the contact part can be created easily by press-molding the metal plate. Accordingly, lower cost can be pursued in this respect as well.

If the component mounting board is connectable with a cable, at least one of the first and second cases may includes a lead-out hole for leading the cable outside, and a connection part. The connection part may surround the lead-out hole and may be contactable with a ground conductor of the cable in a state where the first and second cases contain the component mounting board. In this case, simply placing the component mounting board inside the first and second cases allows the connection part to be connected to the ground conductor of the cable. This aspect of the invention accordingly produce an advantageous effect in reducing costs because the wiring work for connecting the ground conductor of the cable to the first and second cases can be omitted. Moreover, the claimed shield case has an improved shield property because the first and second cases are connected to a ground of electronic equipment through the ground conductor of the cable.

If at least one of the first and second cases is made of a metal plate, the connection part may preferably be a cut piece formed by cutting and bending a portion of the metal plate. In this case, the case and the connection part can be created easily by press-molding the metal plate. Cost reduction can be pursued in this respect as well.

A circuit board assembly of the present invention includes the above-described shield case and the component mounting board to be contained in the shield case.

Preferably, the circuit board assembly further includes first and second plastic cases for containing the shield case. Such circuit board assembly has an improved visual quality because the first and second plastic cases can cover solder, conductive tape, etc. provided in clearances of the shield case as EMI preventive measures.

DESCRIPTION OF EMBODIMENTS

Hereinafter, a circuit board assembly according to an embodiment of the present invention is described in reference to FIGS. 1 to 4.

Figure 1A:
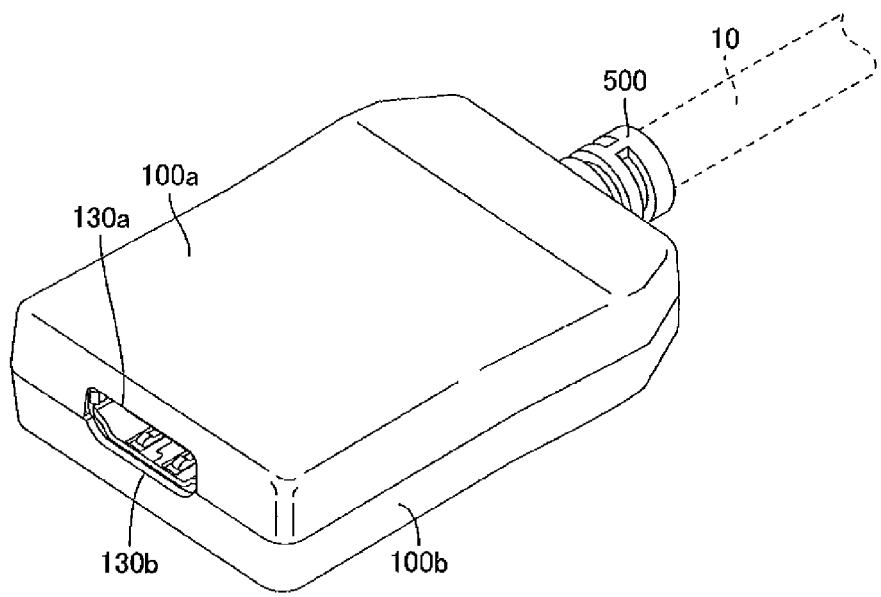
FIG. 1(a) is a schematic perspective view of a circuit board assembly according to an embodiment of the present invention.
Figure 1B:
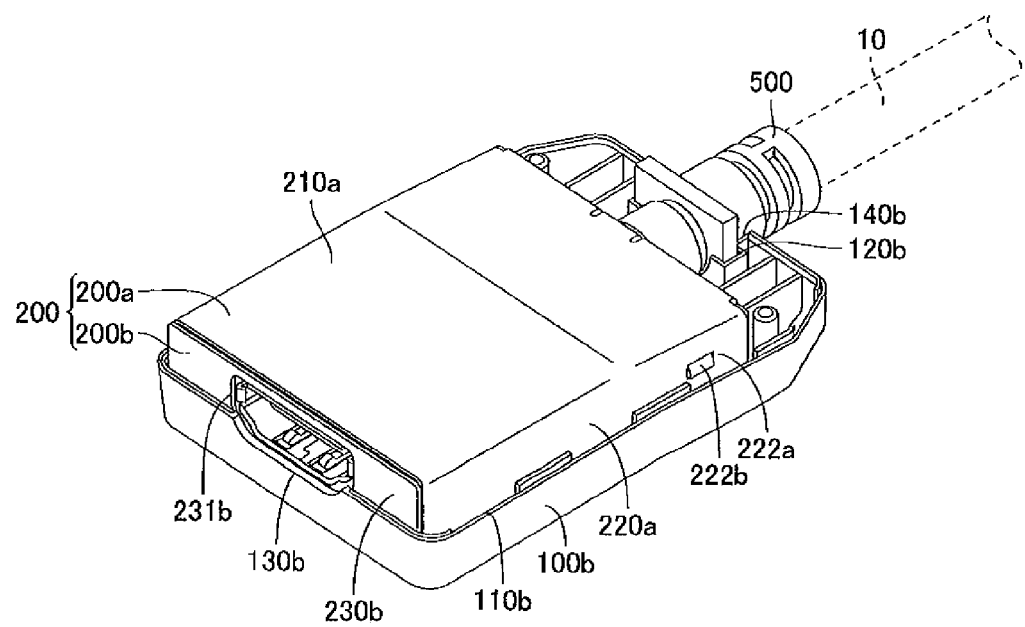
FIG. 1(b) is a schematic perspective view of the same assembly with its upper plastic case removed.

The circuit board assembly as illustrated in FIGS. 1 and 2 is a connector socket applied with electromagnetic interference (EMI) preventive measures, for use with an multicore cable (aggregated cable) 10 capable of transmitting high-speed signals. The circuit board assembly includes upper and lower plastic cases 100a, 100b to be combined with each other, a shield case 200 to be contained in the combined upper and lower plastic cases 100a, 100b, and a component mounting board 300 to be held in suspension inside the shield case 200. These elements of the circuit board assembly are described in detail below, but we will first describe on the multicore cable 10.

Figure 3A:
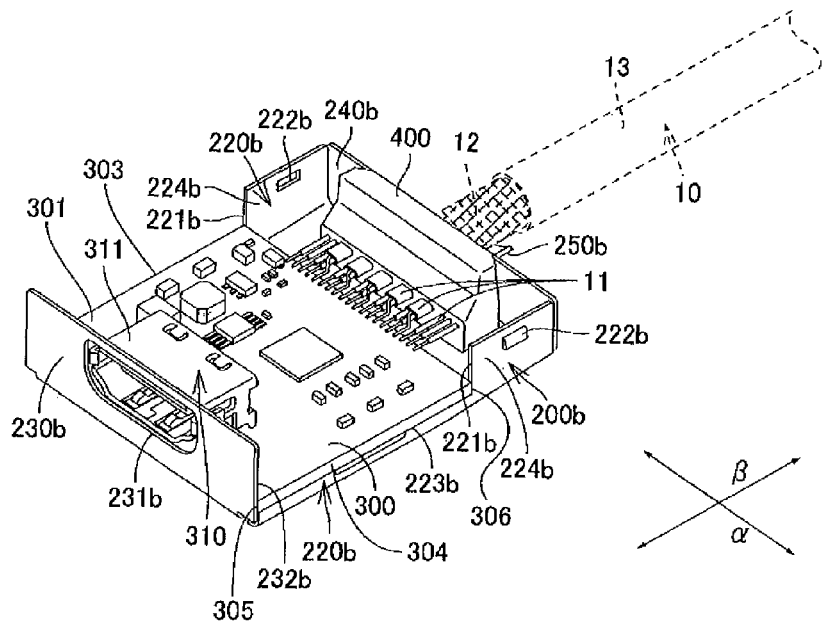
FIG. 3 illustrates a lower shield case of the same assembly with a component mounting board and a cable attached, FIG. 3(a) being a perspective view when seen from one side, and FIG. 3(b) being a perspective view when seen from the other side.
Figure 3B:
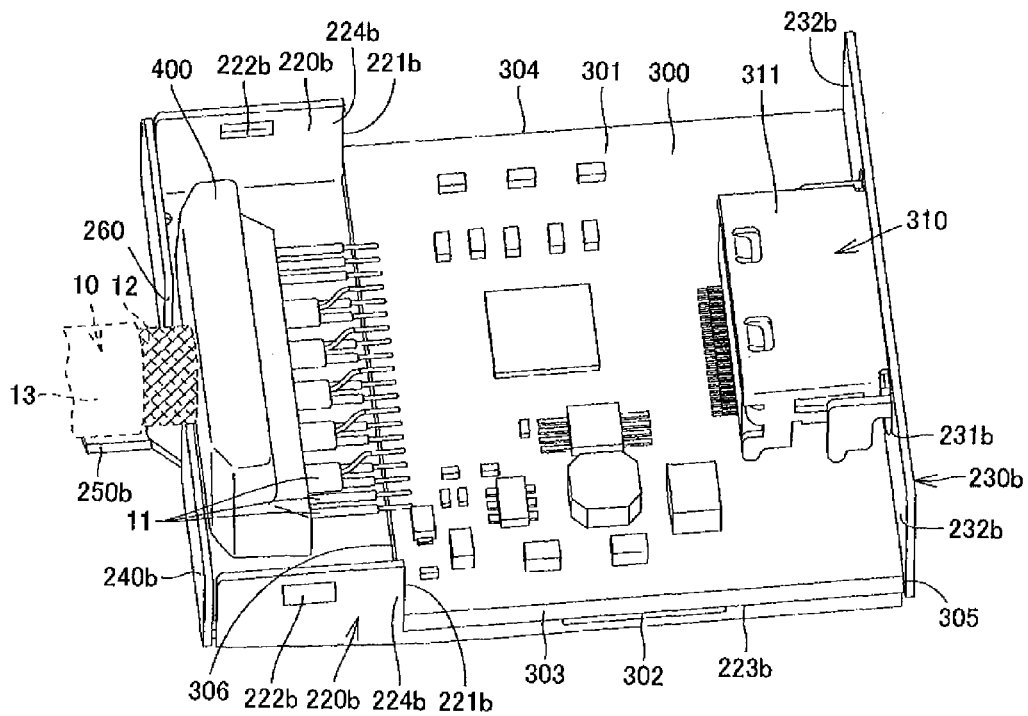

The multicore cable 10, as shown in FIGS. 3(a) and 3(b), consists of a plurality of types of cables 11, a ground conductor 12 covering these cables 11, and an outer insulator 13 covering the ground conductor 12. The multicore cable 10 is processed such that the outer insulator 13 is cut at one end (basal end) to expose the ground conductor 12, and that the exposed ground conductor 12 is cut at one end to expose the plurality of cables 11. The exposed cables 11 are bundled by an insulating resin member 400, details of which will be described later.

Figure 2A:
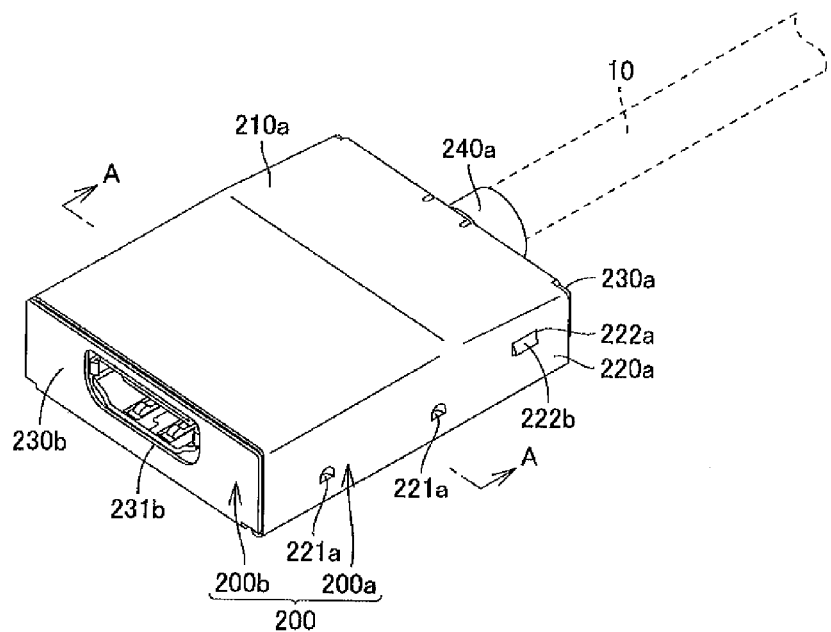
FIG. 2 schematically illustrates the same assembly with its upper and lower plastic cases removed, FIG. 2(a) being a perspective view, and FIG. 2(b) being an A-A cross-sectional view.
Figure 2B:
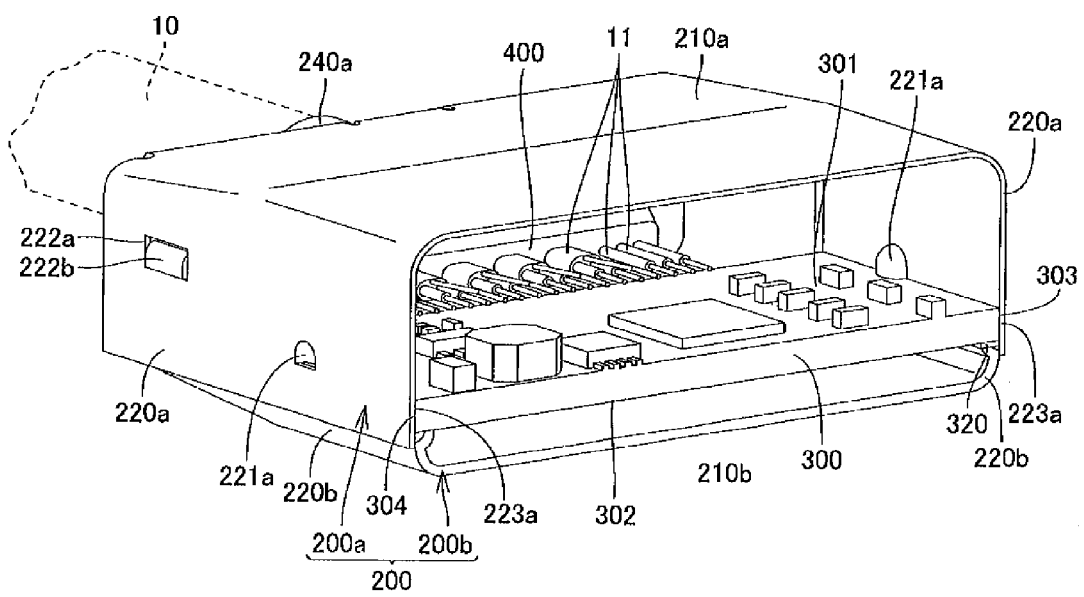

As shown in FIG. 2(b), FIGS. 3(a) and 3(b), the component mounting board 300 is a known print circuit board substantially of a rectangular shape. The board 300 has an upper surface 301 (first surface), a lower surface 302 (second surface) on the opposite side of the upper surface 301, and four surfaces perpendicular to the upper surface, namely, a first side surface 303 (third surface) at an end of the board 300, a second side surface 304 (fourth surface) at the other end of the board 300, a front surface 305 (fifth surface), and a rear surface 306 (sixth surface).

A plurality of types of electronic components are mounted on the upper surface 301 of the component mounting board 300. Among the electronic components, a receptacle 310 (external connection component) for connection with a plug (not shown) is mounted centrally at a front end of the upper surface 301 of the component mounting board 300. At a rear end of the upper surface 301 of the component mounting board 300, there are formed a plurality of conductive lines not shown, to which cable lines of the cables 11 of the multicore cable 10 are connected by soldering. A width direction $\alpha$ of the component mounting board 300 corresponds to a first direction recited in the claims, and a length direction $\beta$ corresponds to a second direction recited in the claims.

The receptacle 310 has a cylindrical shell 311 (shield part) made of conductive metal. The shell 311 accomodates power source pins and signal pins, not shown, which are connected to power source lines and signal lines provided on the upper surface 301 of the component mounting board 300. The shell 311 is connected to a ground line 320 formed on the component mounting board 300.

The ground line 320 is formed at an end of the lower surface 302 of the component mounting board 300, as shown in FIG. 2(b). The ground line 320 in FIG. 2(b) is depicted with its size magnified for the purpose of illustration.

The shield case 200 has an upper case 200a (first case) and a lower case 200b (second case) over which the upper case 200 is put, as shown in FIGS. 2(a) and 2(b).

Figure 4:
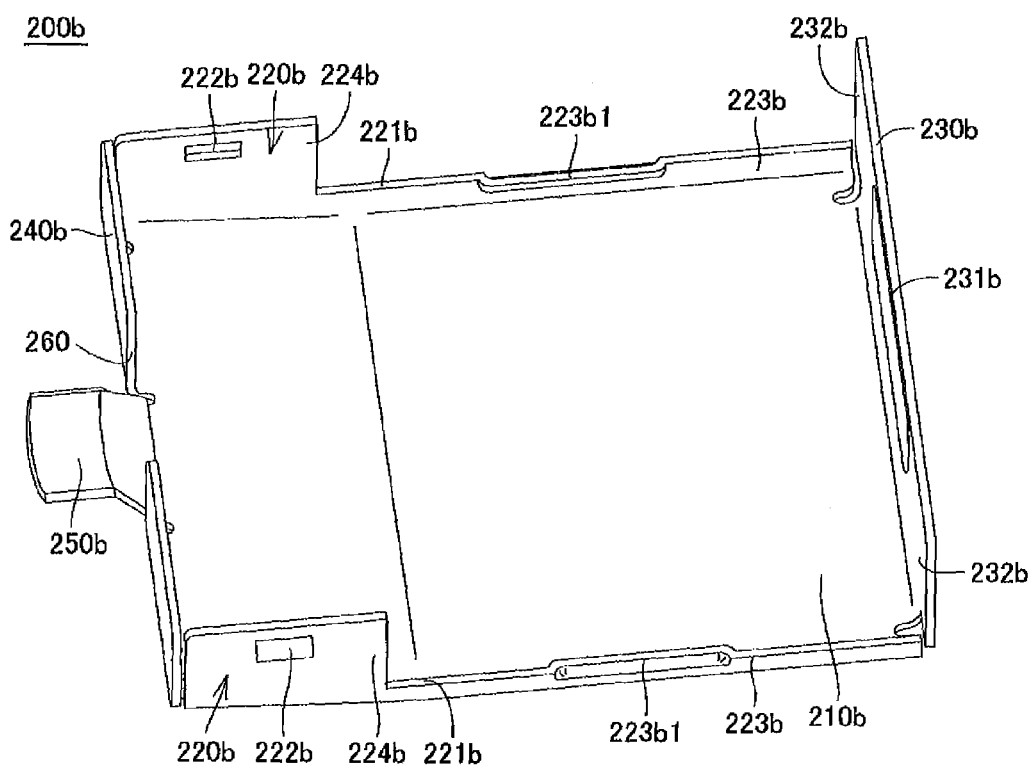
FIG. 4 is a schematic perspective view of the lower shield case of the same assembly.

The lower case 200b is a substantially rectangular box-like body as shown in FIGS. 3(a), 3(b) and 4, formed by press-molding a conductive metal plate.

The lower case 200b has a substantially rectangular bottom plate 210b, a pair of side walls 220b, a front wall 230b, a rear wall 240b, and a lower connection piece 250b. The pair of side walls 220b, the front wall 230b and the rear wall 240b correspond to the peripheral wall recited in the claims.

Each of the side walls 220b is a plate that continues to each edge of the bottom plate 210b and is bent substantially perpendicularly to the bottom plate 210b. The side walls 220b each have a substantially rectangular notch part 221b toward its front end. Toward the rear end of each side wall 220b, there is a locking projection 222b projecting outward. In the drawings, reference numeral 223b refers to a lower edge of the notch part 221b, and 224b refers to a rear edge (one of the outer edges) of the notch part 221b.

The length of the notch parts 221b is slightly larger than the length in the direction $\beta$ of the component mounting board 300. The notch parts 221b can accordingly receive end portions in the width direction $\alpha$ of the component mounting board 300.

Each of the lower edges 223b has a ridge 223b1 protruded inward at its center. The lower edges 223b and the ridges 223b1 abut on ends of the lower surface 302 of the component mounting board 300 inserted in the notch parts 221b. That is, the lower edges 223b correspond to a second abutting part recited in the claims. In the abutted state on the end portion of the lower surface 302 of the component mounting board 300, the lower edges 223b and the ridges 223b1 are brought into contact with the ground line 320. As a result, the lower case 200b is electrically connected to the ground line 320 of the component mounting board 300.

The rear edges 224b abut on respective outer ends of the rear surface 306 of the component mounting board 300 inserted into the notch parts 221b. That is, the rear edges 224b correspond to a sixth abutting part recited in the claims.

The front wall 230b is a substantially rectangular plate that continues to the front edge of the bottom plate 210b and is bent substantially perpendicularly to the bottom plate 210b. At a center of the front wall 230b, there is provided a substantially rectangular opening 231b for exposing the receptacle 310 externally.

Moreover, outer ends of the front wall 230b form front edge parts 232b (the other one of outer edges) of the pair of notch parts 221b of the side walls 220b. These front edge parts 232b abut on respective outer ends of the front surface 305 of the component mounting board 300 inserted into the notch parts 221b. That is, the front edge parts 232b correspond to a fifth abutting part recited in the claims.

The rear wall 240b is a substantially rectangular plate that continues to a rear edge of the bottom plate 210b and is bent substantially perpendicular to the bottom plate 210b. The lower connection piece 250b divides the rear wall 240b into two sections. The space between these sections forms a part of a lead-out hole 260 to lead the multicore cable 10 outside the shield case 200.

The lower connection piece 250b is a plate-like body formed by cutting a central part of the rear wall 240b and bending the this central part outward. This lower connection piece 250b has a base part inclined outward and a circular-ark-shaped front part continuing to the base part. The ground conductor 12 of the multicore cable 10 is placed on the front part of the lower connection piece 250b for electrical connection. The lower case 200b is thus electrically connected to the ground conductor 12 of the multicore cable 10, i.e., connected to a ground of electronic equipment not shown through the multicore cable 10.

The insulating resin member 400 is placed at a rear end of the bottom plate 210b. The resin member 400 bundles the cables 11 connected to the component mounting board 300 in the state where the ends of the component mounting board 300 are inserted into the notch parts 221b.

The upper case 200a is a box-like body having a U shape in cross-sectional view as shown in FIGS. 2(a) and 2(b), formed by press-molding a conductive metal plate.

The upper case 200a has a top plate 210a, a pair of side walls 220a (first and second side walls), a rear wall 230a, and an upper connection piece 240a.

The width of the top plate 210a is made slightly larger than the width of the bottom plate 210b of the lower case 200b.

Each of the side walls 220a is a substantially rectangular plate body that continues to each edge of the top plate 210a and is bent substantially perpendicularly to the top plate 210a. The side walls 220a each have two projections 221a in a spaced relationship toward its front end. A locking hole 222a is formed toward the rear end of each side wall 220a.

The locking holes 222a are shaped to fittingly receive the locking projections 222b of the lower case 200b. This allows the upper case 200a to be locked while covering the lower case 200b.

When the upper case 200a is placed over the lower case 200b, the projections 221a abut on ends of the upper surface 301 of the component mounting board 300. That is, the projections 221a correspond to a first abutting part recited in the claims. Lower surfaces of the projections 221a of the side walls 220a are spaced apart from the top plate 210a by such a distance that the top plate 210a does not contact any of the electronic components on the component mounting board 300 in a state where the projections 221a abut on the ends of the upper surface 301 of the component mounting board 300.

Moreover, a distance between inner surfaces of the pair of side walls 220a is set to be substantially the same as a distance between outer surfaces of the paired side walls 220b of the lower case 200b, and the same as a distance between the first and second side surfaces 303, 304 of the component mounting board 300. Because of such configuration, when the upper case 200a is placed over the lower case 200b as shown in FIG. 2(b), the side walls 220a extend along the outer surfaces of the side walls 220b of the lower case 200b, and the notch parts 221b of the side walls 220b are covered by portions of side walls 220a. The lower ends 223a of these portions are abuttable on the first and second side surfaces 303, 304 of the component mounting board 300. That is, the lower ends 223a of the side walls 220a correspond to third and fourth abutting parts recited in the claims.

The rear wall 230a is a substantially rectangular plate that continues to a rear edge of the top plate 210a and is bent substantially perpendicular to the top plate 210a. The upper connection piece 240a divides the rear wall 230a into two sections. The space between these sections forms the remaining part of the lead-out hole 260 to lead the multicore cable 10 outside the shield case 200.

The upper connection piece 240a is a plate-like body formed by cutting a central part of the rear wall 230a and bending this central part outward. This upper connection piece 240a has a base part inclined outward and a circular-ark-shaped front part continuing to this base part. The combination of this front part and the front part of the lower connection piece 250b forms a substantially circular shape. The ground conductor 12 of the multicore cable 10 is to contact on the front part of the upper connection piece 240a for electrical connection. The upper case 200a is thus electrically connected to the ground conductor 12 of the multicore cable 10, i.e., connected to the ground of the electronic equipment through the multicore cable 10.

The upper connection piece 240a and the lower connection piece 250b connected to the ground conductor 12 of the multicore cable 10 are covered with a bush 500.

The upper plastic case 100a and the lower plastic case 100b are substantially rectangular box-like bodies as shown in FIG. 1, formed by injection-molding insulative resin.

The lower plastic case 100b has a substantially rectangular concave housing 110b inside its peripheral wall, a rectangular concave mount 120b provided in the rear of the concave housing 110b, an opening 130b formed in a front face of the peripheral wall and in communication with the concave housing 110b, and a lead-out hole 140b formed in a back face of the peripheral wall and in communication with the concave mount 120b.

The concave housing 110b fittingly receives a lower portion of the shield case 200. When the upper plastic case 100a and the lower plastic case 100b are combined, the opening 130b communicates with an opening 130a of the upper plastic case 100a to form a hole of substantially the same shape as that of the opening 231b of the shield case 200. That is, the opening 130b and the opening 130a in combination serve as a hole for externally exposing the receptacle 300 mounted on the upper surface 301 of the component mounting board 300.

The concave mount 120b fittingly receives a lower portion of a rectangular flat plate of the bush 500. When the upper plastic case 100a and the lower plastic case 100b are combined, the lead-out hole 140b communicates with a lead-out hole (not shown) of the upper plastic case 100a to form a substantially circular hole. The hole is used to lead the cable 10 outside the upper and lower plastic cases 100a, 100b.

The upper plastic case 100a has substantially the same, up side down, configuration as the lower plastic case 100b. As such, no further details of the upper plastic case 100a will not be given.

The circuit board assembly as described above is assembled in the following steps. First, cable cores of the plurality of types of cables 11 of the multicore cable 10 as bundled by the insulating resin member 400 are connected to the respective conductive lines of the component mounting board 300 by soldering.

Thereafter, the ends in the width direction α of the component mounting board 300 are inserted into the respective notch parts 221*b* of the lower case 200*b*, while the insulating resin member 400 is set on the rear end of the bottom plate 210*b* of the lower case 200*b*. At this time, the ground conductor 12 of the multicore cable 10 is placed on the lower connection piece 250*b* of the lower case 200*b*.

After inserting the component mounting board 300 into lower case 200*b* in the above manner, as shown in FIG. 3(*b*), the widthwise (α) end portions of the lower surface 302 are placed on the respective lower edges 223*b* and ridges 223*b*1 of the paired side walls 220*b* of the lower case 200*b*, the widthwise (α) ends of the rear surface 306 abut on the respective rear edges 224*b* of the side walls 220*b*, and the widthwise (α) ends of the front surface 305 abut on the respective front edge parts 232*b* at outer ends of the front wall 230*b* of the lower case 200*b*. As a result, the lower surface 302, the front surface 305 and the rear surface 306 of the component mounting board 300 are fixed in position by the lower edges 223*b*, the rear edges 224*b*, and the front edge parts 232*b*, so that the component mounting board 300 is restrained from moving in the length direction β.

At this time, the ground line 320 of the component mounting board 300 comes into contact with the lower edge 223*b* and the ridge 223*b*1. This contact brings the lower case 200*b* into electrically connection with the ground line 320 of the component mounting board 300.

Thereafter, the upper case 200*a* is disposed over the lower case 200*b*. Thereby, the paired side walls 220*a* of the upper case 200*a* abut on the respective outer surfaces of the paired side walls 220*b* of the lower case 200*b*, and the locking holes 222*a* of the side walls 220*a* fittingly receive the locking projections 222*b* of the side walls 220*b*. At the same time, the rear wall 230*a* of the upper case 200*a* abuts on the rear wall 240*b* of the lower case 200*b*. As a result, the upper case 200*a* and the lower case 200*b* are combined and electrically connected with each other.

At this time, the two projections 221*a* of each of the paired side walls 220*a* (four projections in total) abut the widthwise (α) ends of the upper surface 301 of the component mounting board 300, and the lower ends 223*a* of the side walls 220*a* abut on the first and second side surfaces 303, 304 of the component mounting board 300. As a result, the upper surface 301 and the first and second side surfaces 303, 304 of the component mounting board 300 are fixed in position by the projections 221*a* and the lower ends 223*a* of the side walls 220*a*. In this manner, the component mounting board 300 is held in suspension inside the upper case 200*a* and the lower case 200*b*.

Additionally, the upper connection piece 240*a* covers the ground conductor 12 of the multicore cable 10 from above. In this state, the upper connection piece 240*a* and the lower connection piece 250*b* are connected to the ground conductor 12 by soldering, so that the upper case 200*a* and the lower case 200*b* are electrically connected to the ground conductor 12.

Thereafter, the distal end of the multicore cable 10 is inserted into the bush 500, so that the bush 500 covers the basal end of the multicore cable 10, the upper connection piece 240*a* and the lower connection piece 250*b*.

The lower portion of the combined upper and lower cases 200*a*, 200*b* is then fitted into the concave housing 110*b* of the lower plastic case 100*b*. At the same time, the lower portion of the flat plate of the bush 500 is inserted into the concave mount 120*b* of the lower plastic case 100*b*, and the bush 500 and the multicore cable 10 are fit into the lead-out hole 140*b*.

Thereafter, the upper plastic case 100*a* is attached to the lower plastic case 100*b*. The remaining upper portion of the combined upper and cases 200*a*, 200*b* is fitted into a concave housing of the upper plastic case 100*a*. At the same time, the upper portion of the flat plate of the bush 500 is fitted into the concave mount of the upper plastic case 100*a*, so that the bush 500 and the multicore cable 10 are fitted into the lead-out hole of the upper plastic case 100*a*. Accordingly, the multicore cable 10 is led through the lead-out hole 140*b* and the lead-out hole of the upper plastic case 100*a* to the outside of the upper plastic case 100*a* and the lower plastic case 100*b*. In the above manner, the circuit board assembly is assembled.

In the above-described circuit board assembly, simply by inserting the end portions in the width direction α of the component mounting board 300 into the paired notch parts 221*b* of the lower case 200*b*, the end portions in the width direction α in the lower surface 302, the front surface 305, and the rear surface 306 of the component mounting board 300 are fixed in position by the lower edges 223*b*, the rear edges 224*b* and the front edge parts 232*b* of the lower case 200*b*, respectively. Moreover, simply by putting the upper case 200*a* over the lower case 200*b*, the ends in the width direction α of the upper surface 301, the first and second side surfaces 303, 304 of the component mounting board 300 are fixed in position by the projections 221*a* and the lower ends 223*a* of the side walls 220*a* of the upper case 200*a*. Thus, the above circuit board assembly is advantageous for easy incorporation of the component mounting board 300 into the shield case 200.

Another advantage of the above circuit board assembly is a reduced height and a reduced number of components. Particularly, the component mounting board 300 is held in suspension by the upper case 200*a* and the lower case 200*b* themselves, obviating the need for an insulating holding member for holding the component mounting board 300 in suspension inside the upper case 200*a* and the lower case 200*b* as in the conventional art. Thus, the present assembly is easy to incorporate the component mounting board 300 into the shield case 200, and the number of the components can be reduced, leading to reduction of costs.

The above circuit board assembly has a further advantageous feature to reduce costs. Particularly, simply by inserting the end portions in the width direction α of the component mounting board 300 into the paired notch parts 221*b* of the lower case 200*b* to set the end portions on the lower edges 223*b* and the ridges 223*b*1, the ground line 320 of the component mounting board 300 comes into contact with the lower edge 223*b* and the ridges 223*b*1, so that the ground line 320 is electrically connected to the lower case 200*b*. Therefore, it is possible to eliminate wiring work for connecting between the ground line 320 of the component mounting board 300 and the shield case 200.

Furthermore, the upper case 200*a* and the lower case 200*b* are produced inexpensively by press-molding metal plates. Cost reduction can be further pursued in this respect.

A still another advantageous feature of the above circuit board assembly is an improved shield property. The upper connection piece 240*a* and the lower connection piece 250*b* as combined are electrically connected to the ground conductor 12 of the multicore cable 10. By way of the ground conductor 12 of the multicore cable 10 and the shield case 200, the ground line 320 of the component mounting board 300 is connected to the ground of electronic equipment.

Figure 5:
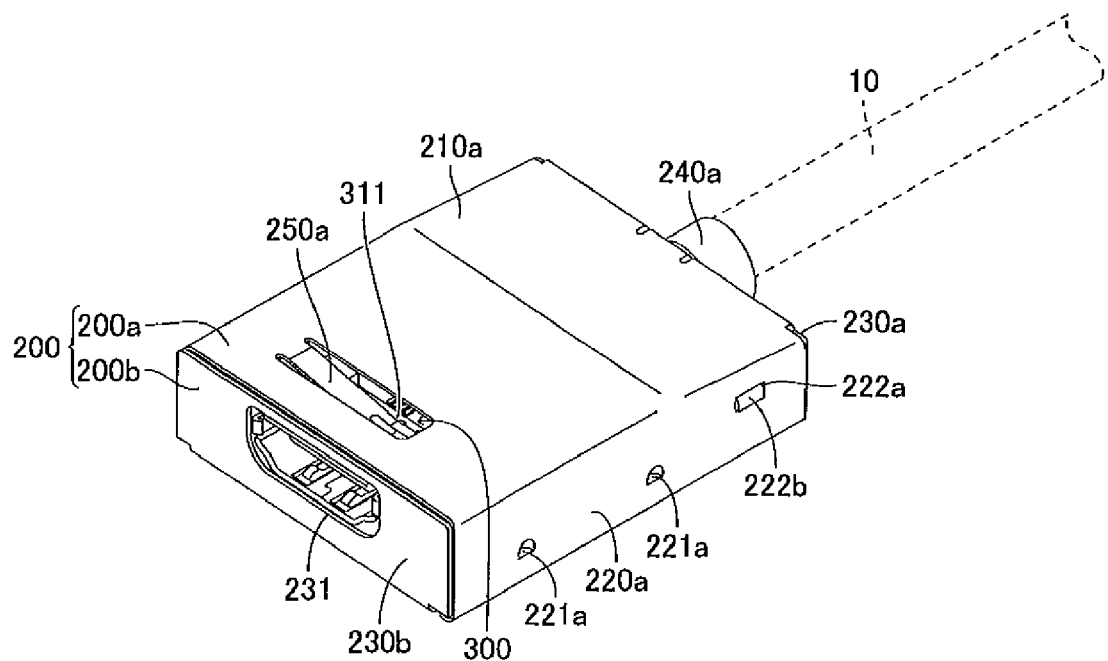
FIG. 5 is a schematic perspective view exemplifying a design modification of the shield case of the present invention.

The invention is not limited to the shield case and the circuit board assembly described as the above embodiment, but various modifications in design may be made as long as they conform to the gist of the claims. FIG. 5 is a schematic perspective view illustrating one of such design modifications of the shield case of the present invention.

The shield case 200 of the above embodiment includes the upper case 200a and the lower case 200b over which the upper case 200a is put. However, the shield case may be modified in any manner as long as it includes first and second cases as two combinable pieces.

Moreover, although the upper case 200a and the lower case 200b described above are each made of a metal plate having conductivity, they are not limited to this. For example, they may be each a plastic case whose inner surface and outer surface are subjected to metal plating.

While the six abutting parts are provided in the shield case in the above-described embodiment, the number of the abutting parts may be changed in accordance with the number of the surfaces of the component mounting board. It is optional which of the first and the second cases the abutting parts are provided. The abutting parts may be modified in design as long as they are adapted to abut on all the surfaces of the component mounting board and hold the component mounting board in suspension in the state where the first and second cases are combined.

For example, in place of the projections and the edge parts of the notch parts, the abutting parts may be bent parts or the like. Specifically, the pair of side walls 220b of the lower case 200b may be each bent outward into a substantially L shape, so that lower end portions thereof may each function as the second abutting part and upper end portions thereof may function as the third and fourth abutting parts. In this case, the upper case 200a may be formed into a substantially U shape in cross-sectional view, in which its front and rear walls may function as the fifth and the sixth abutting parts, the front wall and the rear wall may have projections to function as the first abutting part. Obviously, the front wall and the rear wall may be bent outward into a substantially L shape, so that their upper end portions may function as the first abutting part and their lower end portions may function as the fifth and sixth abutting parts.

In the embodiment, the pair of notch parts 221b is provided toward its front end of the side walls 220b. However, the pair notch parts may be modified in design as long as they are disposed opposite to each other in the peripheral wall of the lower case 200b. For example, the notch parts can also be provided in intermediate portions of the side walls 220b. In this case, the front-side edge parts of the side walls 220b function as the fifth abutting part.

The notch parts may also be provided in the front wall 230b and the rear wall 240b. In this case, lower edges of the notch parts may abut on a front end portion and a rear end portion of the lower surface 302 of the component mounting board 300, respectively, while outer edges of the notch parts may abut on the widthwise end surfaces 303, 304 of the component mounting board 300, (i.e., the outer edges function as the third and fourth abutting parts). In accordance with these notch parts in the lower case, the paired side walls of the upper case may be extended along the front wall 230b and the rear wall 240b and may abut on the front surface 305 and the rear surface 306 of the component mounting board 300 (i.e., the side walls function as the fifth and sixth abutting parts). The side walls of the upper case only need to cover the notch parts in the state where the upper case is put over the lower case.

Furthermore, height positions of the lower edges 223b can be varied by varying the depths of the notch parts, allowing for a case, for example, where the upper and lower surfaces 301, 302 of the component mounting board 300 are used for mounting electronic components as described later. More specifically, by decreasing the depths of the notch parts to raise the height position of the lower edges 223b, it is easy to modify the design such that no electronic component on the lower surface 302 side comes into contact with the lower case 200b.

It is described in the above embodiment that the upper case 200a is put over the lower case 200b after the component mounting board 300 is inserted into the notch parts 221b of the lower case 200b. In stead, the lower case 200b may be attached to the upper case 200a after the component mounting board 300 is inserted into the side walls 220a of the upper case 200a to be set on the projections 221a. In this case, it the upper case 200a and the lower case 200b are used as the lower case and the upper case, respectively, it is possible to abut the lower surface 302 of the component mounting board 300 on the projections 221a and abut the upper surface 301 of the component mounting board 300 on the lower edges 223b. Such case may be applied to the notch parts 221b modified in design as described above.

Moreover, the above-described embodiment has the lower edges 223b abuttable on the ends of the lower surface 302 of the component mounting board 300 and contactable with the ground line 320 of the component mounting board 300. However, a modification can be made in design so that the lower edge 223b does not contact the ground line 320. In this case, the ground line may be contacted by at least one of the first to sixth abutting parts. Alternatively, the ground line may be connected, via another connecting means, to the shield case or to another ground such as the ground conductor 12 of the multicore cable 10. It is optional whether or not the ridges 223b1 are provided in the lower edges 223b.

Moreover, in place of bringing the lower edge 223b into contact with the ground line 320, as shown in FIG. 5, a cut piece 250a (contact part) may be brought into contact with the shell 311 of the receptacle 310 in the state where the upper case 200a is put over the lower case 200b. The cut piece 250a is formed by cutting a portion of the top plate 210a of the upper case 200a and bending the same downward. Also in this case, the ground line 320 of the component mounting board 300 may be connected to the ground of the external electronic equipment through any one of the upper case 200a and the lower case 200b and the ground conductor 12 of the multicore cable 10. It is also possible to bring the lower edge 223b into contact with the ground line 320 and bring the cut piece 250a into contact with the shell 311.

The cut piece 250a is not limited to the above-described one formed by cutting and bending a portion of the upper case. The cut piece 250a may be modified in design as long as it is a contact part contactable with a shield part of an external connection component of any type (details to be described later) The contact part may be provided in at least one of the first and second cases and may be omitted optionally.

As for the projections 221a, although a total of four projections are provided in the above-described embodiments, at least one suffices and the number thereof can be changed as needed.

The component mounting board 300 may have any configuration as long as the electronic components can be mounted thereon. That is, the component mounting board is not limited to one having the first to sixth surfaces, but may have any other polygonal shape. Moreover, although it is described in the above-described embodiments that the upper surface of the component mounting board is used as the electronic component mounting surface, any other surface or a plurality of surfaces may be used. The invention is not limited to the case disclosed in the above-described embodiments where the upper surface 301 of the component mounting board 300 corresponds to the first surface recited in the claims, the lower surface 302 corresponds to the second surface, the first side surface 303 corresponds to the third surface, the second side surface 304 is the fourth surface, the front surface 305 is the fifth surface, and the rear surface 306 is the sixth surface. For example, possible is case where the upper surface of the component mounting board 300 is the second surface, the lower surface is the first surface, the first side surface is the third surface, the second side surface is the fourth surface, the front surface is the fifth surface, and the rear surface is the sixth surface. Also possible is a case where the upper surface of the component mounting board 300 is the second surface, the lower surface is the first surface, the first side surface is the fifth surface, the second side surface is the sixth surface, the front surface is the third surface, and the rear surface is the fourth surface.

The external connection component may be any component other than the receptacle 310 to be mounted on the upper surface 301 of the component mounting board 300 as described in the above embodiment. The external connection component may be provided in at least one of the first surface and the second surface of the component mounting board or may be omitted.

The multicore cable 10 may be any communication cable, such as a coaxial cable capable of transmitting high-speed signals. The ground conductor 12 of the cable 10 may be connected to the upper connection piece 240a and the lower connection piece 250b as described in the embodiment, but may optionally be connected to any connection part connectable to the ground conductor. Moreover, the connection part can be omitted. If omitted, another connection means may be employed to connect the shield case to a ground of external electronic equipment. For example, connection to a ground of external electronic equipment may be provided through a plug connected to the receptacle 310, with the shell 311 of the receptacle 310 in contact with a shell of the plug.

The circuit board assembly according to the present invention is not limited to a cable connector described as the above embodiment. Alternatively, it may be any other circuit board assembly with EMI preventive measures applied in a similar manner as in the above cable connector. The shield case is not limited to the above embodiment.

The first direction α only needs to be a direction along the first surface of the component mounting board, and the second direction β only needs to be a direction extending along the first surface and intersecting with the first direction.

Any modifications in design may be made to the shapes and the numbers of the elements of the shield case and the circuit board assembly according to the present invention, as long as such modifications provide similar functions to those in the above-described embodiments are implemented.

REFERENCE SIGNS LIST

10. Multicore cable
  11. Cable
  12. Ground conductor
100a. Upper plastic case
100b. Lower plastic case
200. Shield case
  200a. Upper case (first case)
  220a. Side wall
  221a. Projection (first abutting part)
  223a. Lower end (third and fourth abutting parts)
  240a. Upper connection piece (connection part)
  200b. Lower case (second case)
  220b. Side wall
  221b. Notch part
  223b. Lower edge (second abutting part)
  224b. Rear edge (sixth abutting part)
  230b. Front wall
  231b. Opening
  232b. Front edge part (fifth abutting part)
  250b. Lower connection piece (connection part)
300. Component mounting board
  310. Receptacle (external connection component)
  311. Shell (shield part)
  320. Ground line

CITATION LIST

Patent Literature 1: Japanese Unexamined Patent Publication No. 2005-99506
Patent Literature 2: Japanese Unexamined Utility Model Publication No. 02-120783

The invention claimed is:
1. An electrically conductive shield case adapted to contain a component mounting board, the component mounting board including:
  a first surface,
  a second surface in opposed relation to the first surface,
  third and fourth surfaces being end surfaces at ends in a first direction, the first direction being parallel to the first surface, and
  fifth and sixth surfaces being end surfaces at ends in a second direction, the second direction being parallel to the first surface and intersecting the first direction,
the shield case comprising:
  a first case comprising first, third, and fourth abutting parts; and
  a second case combinable with the first case, the second case comprising second, fifth, and sixth abutting parts,
  wherein, in a state where the first and second cases are combined and contain the component mounting board, the first, second, third, fourth, fifth, and sixth abutting parts abut the first, second, third, fourth, fifth, and sixth surface, respectively, of the component mounting board and hold the component mounting board in suspension,
  wherein the second case is substantially of a box shape and further comprises a peripheral wall, the peripheral wall including substantially rectangular first and second notch parts in opposed positions to receive end portions in the first direction of the component mounting board, the first and second notch parts each including a first edge being a lower edge, a second edge on a first side in the second direction, and a third edge on a second side in the second direction,
  wherein the second abutting part comprises the first edges of the first and second notch parts and, when the first and second notch pairs receive the end portions of the component mounting board, the first edges abut on the second surface of the end portions of the component mounting board, and
  wherein the fifth abutting part comprises the second edges of the first and second notch parts, the sixth abutting part comprises the third edges of the first and second notch parts, and, when the first and second notch parts receive the end portions of the component mounting board, the second and third edges abut on the fifth and sixth surfaces respectively, of the component mounting board.

2. The shield case according to claim 1, wherein
the first case substantially of a U shape in cross-sectional view is adapted to be disposed over the second case and includes first and second side walls for covering the first and second notch parts of the second case,
the first and second side walls include the third and fourth abutting parts, respectively, the third and fourth abutting parts being adapted to cover the first and second notch parts, respectively, and abuttable on the third and fourth surfaces, respectively, of the component mounting board in a state where the first and second side walls cover the first and second notch parts, and
the first abutting part comprises a pair of projections each provided in the first and second side walls, respectively, and the projections being abuttable on respective ends of the first surface of the component mounting board in a state where the first case is disposed over the second case.

3. The shield case according to claim 1, at least one of the surfaces of the component mounting board having a ground line,
wherein at least one of the abutting parts is contactable with the ground line while abutting on the at least one surface.

4. The shield case according to claim 1, the second surface of the component mounting board having a ground line,
wherein the second abutting part is contactable with the ground line while abutting on the second surface.

5. The shield case according to claim 1, wherein the second case comprises a metal plate.

6. The shield case according to claim 2, wherein the first and second cases each comprises a metal plate.

7. The shield case according to claim 1, wherein
at least one of the first and second surfaces of the component mounting board is provided with an external connection component, and
at least one of the first and second cases has an opening for exposing the external connection component therefrom.

8. The shield case according to claim 7,
wherein at least one of the first and second cases has a contact part contactable with a shield part of the external connection part in a state where the first and second cases contain the component mounting board.

9. The shield case according to claim 8, wherein at least one of the first and second cases comprises a metal plate, and
the contact part comprises a cut piece formed by cutting and bending a portion of the metal plate.

10. The shield case according to any one of claims 1, 3 and 4, the component mounting board being connectable with a cable,
wherein at least one of the first and second cases comprises: a lead-out hole for leading the cable outside, and a connection part, surrounding the lead-out hole and being contactable with a ground conductor of the cable in a state where the first and second cases contain the component mounting board.

11. The shield case according to claim 10,
wherein at least one of the first and second cases comprises a metal plate, and
the connection part comprises a cut piece formed by cutting and bending a portion of the metal plate.

12. A circuit board assembly comprising:
the shield case according to any one of claims 1, 3 and 4; and
the component mounting board to be contained in the shield case,
wherein the component mounting board comprises:
the first surface,
the second surface in opposed relation to the first surface,
the third and fourth surfaces being the end surfaces at the ends in a first direction, the first direction being parallel to the first surface, and
fifth and sixth surfaces being the end surfaces at the ends in the second direction, the second direction being parallel to the first surface and intersecting the first direction.

13. The circuit board assembly according to claim 12, further comprising first and second plastic cases for containing the shield case.

* * * * *